United States Patent
Mohebbi et al.

(10) Patent No.: US 11,047,936 B2
(45) Date of Patent: Jun. 29, 2021

(54) SHIFTING PHASE IN A RESONATOR DEVICE FOR MAGNETIC RESONANCE

(71) Applicant: Quantum Valley Investment Fund LP, Waterloo (CA)

(72) Inventors: Hamidreza Mohebbi, Kitchener (CA); Grum Teklemariam, Kitchener (CA); David Cory, Branchton (CA)

(73) Assignee: Quantum Valley Investment Fund LP, Waterloo (CA)

( * ) Notice: Subject to any disclaimer, the term of this patent is extended or adjusted under 35 U.S.C. 154(b) by 532 days.

(21) Appl. No.: 15/745,513

(22) PCT Filed: Jul. 21, 2016

(86) PCT No.: PCT/CA2016/000196
§ 371 (c)(1),
(2) Date: Jan. 17, 2018

(87) PCT Pub. No.: WO2017/011897
PCT Pub. Date: Jan. 26, 2017

(65) Prior Publication Data
US 2018/0210042 A1    Jul. 26, 2018

Related U.S. Application Data

(60) Provisional application No. 62/196,166, filed on Jul. 23, 2015.

(51) Int. Cl.
*G01R 33/345* (2006.01)
*G01R 33/36* (2006.01)
(Continued)

(52) U.S. Cl.
CPC ........... *G01R 33/345* (2013.01); *G01R 33/36* (2013.01); *G01R 33/3685* (2013.01);
(Continued)

(58) Field of Classification Search
CPC ........ G01R 33/34007; G01R 33/34023; G01R 33/345; G01R 33/36; G01R 33/3685;
(Continued)

(56) References Cited

U.S. PATENT DOCUMENTS 5,223,808 A    6/1993   Lee et al.
5,455,545 A †  10/1995  Garcia
(Continued)

FOREIGN PATENT DOCUMENTS

CN    1445924      10/2003
CN    101460860    6/2009
(Continued)

OTHER PUBLICATIONS

Mohebbi, H. R., et al. "Composite arrays of superconducting microstrip line resonators." Journal of Applied Physics 115.9 (Mar. 2014): 094502. (Year: 2014).*
(Continued)

*Primary Examiner* — Rishi R Patel
(74) *Attorney, Agent, or Firm* — Henry Patent Law Firm PLLC (57) ABSTRACT

In some aspects, a resonator device includes a dielectric substrate, a ground plane on a first side of the substrate, and conductors on a second, opposite side of the substrate. The conductors include first and second resonators and two baluns. Each balun includes a feed, a first branch and a second branch. The feed is connected to the first and second branches, and the first and second branches are capacitively coupled to the respective first and second resonators. The first branch includes a delay line configured to produce a phase shift relative to the second branch. The resonator device includes a sample region configured to support a magnetic resonance sample between the first and second resonators.

15 Claims, 9 Drawing Sheets

(51) Int. Cl.

| | |
|---|---|
| G01R 33/60 | (2006.01) |
| G01R 33/34 | (2006.01) |
| G01R 33/46 | (2006.01) |
| G01R 33/48 | (2006.01) |

(52) U.S. Cl.
CPC .. *G01R 33/34007* (2013.01); *G01R 33/34023* (2013.01); *G01R 33/46* (2013.01); *G01R 33/48* (2013.01); *G01R 33/60* (2013.01)

(58) Field of Classification Search
CPC ........ G01R 33/46; G01R 33/48; G01R 33/60; G01R 33/34
See application file for complete search history.

(56) References Cited

U.S. PATENT DOCUMENTS

| | | | |
|---|---|---|---|
| 5,781,011 | A | 7/1998 | Scholes et al. |
| 5,949,311 | A | 9/1999 | Weiss et al. |
| 6,771,070 | B2 | 8/2004 | Lee |
| 6,828,789 | B2 | 12/2004 | Hyde et al. |
| 7,088,104 | B2 | 8/2006 | Bottomley |
| 7,391,212 | B2 | 6/2008 | Maier et al. |
| 8,045,319 | B2 | 10/2011 | Ritter et al. |
| 8,531,250 | B1 | 9/2013 | Luschas |
| 8,570,033 | B2 | 10/2013 | Prisner et al. |
| 8,587,314 | B2 | 11/2013 | Burns |
| 9,841,484 | B2 | 12/2017 | Mohebbi et al. |
| 2007/0279061 | A1* | 12/2007 | Erickson ............ G01R 33/5659 324/322 |
| 2008/0231281 | A1 | 9/2008 | Fain et al. |
| 2009/0219019 | A1 | 9/2009 | Taherian et al. |
| 2009/0224846 | A1† | 9/2009 | Meharry |
| 2010/0253351 | A1* | 10/2010 | Huish ................. G01R 33/3692 324/318 |
| 2011/0050225 | A1 | 3/2011 | Prisner et al. |
| 2012/0068706 | A1 | 3/2012 | Prisner et al. |
| 2013/0093424 | A1 | 4/2013 | Blank et al. |
| 2014/0125339 | A1 | 5/2014 | Lee et al. |
| 2014/0218032 | A1† | 8/2014 | Mohebbi et al. |

FOREIGN PATENT DOCUMENTS

| | | |
|---|---|---|
| EP | 2269045 | 1/2011 |
| WO | 2014/117256 | 8/2014 |

OTHER PUBLICATIONS

Veciana, Jaume, et al., "Free Radicals as Clathrate Hosts: Crystal and Molecular Structure of 1 : 1 Perchlorotriphenylmethyl Radical-Benzene", J. Chem. Soc., Chem. Commun., pp. 812-814, 1987, 3 pages.
Zmuidzinas, Jonas, "Superconducting Microresonators: Physics and Applications", Annu. Rev. Condens. Matter Phys. 2012.3:169-214, May 11, 2017, 48 pages.
JPO, Office Action issued in JP Patent App. No. 2015-555503 dated Aug. 28, 2017, 3 pgs.
State Intellectual Property Office of P.R. China, Notification of First Office Action in Chinese App. No. 201480007199.9 dated Jun. 13, 2017, with English language translation, 37 pages.
USPTO, Notice of Allowance in U.S. Appl. No. 13/931,382 dated Apr. 24, 2017, 9 pages.
WIPO, International Search Report and Written Opinion of the ISA, dated Oct. 20, 2016, in PCT/CA2016/000196, dated Oct. 20, 2016, 9 pgs.
Benningshof et al., "Superconducting microstrip resonator for pulsed ESR of thin films," Journal of Magnetic Resonance, vol. 230, pp. 84-87, Feb. 2013.
"Extended European Search Report issued in EPO Application No. 14745648.7 dated Oct. 6, 2016, 9 pages".

"Fan et al., "Microstrip Resonator as a Measuring Device for a Single Molecule Magnet", Process in Electromagnetics Research Symposium Proceedings, Cambridge, USA, Jul. 5-8, 2010, pp. 1146-1150".
"Henderson et al., "High Frequency Microstrip Cross Resonators for Circular Polarization Electron Paramagnetic Resonance Spectroscopy", Review of Scientific Instruments, vol. 79, No. 074704, Jul. 21, 2008, pp. 074704-1 to 074704-4, doi: 10.1063/1.2957621".
"International Search Report and Written Opinion of the International Searching Authority issued in International Application No. PCT/CA2014/000068 dated Mar. 17, 2014, 12 pages".
Tavis, Michael, et al., "Exact Solution for an N-Molecule-Radiation-Field Hamiltonian", Physical Review 170, 2, pp. 379-384, Jun. 10, 1968, 6 pages.
"Johansson et al., "A stripline resonator for ESR," Review of Scientific Instruments, vol. 45, No. 11, pp. 1445-1447, Nov. 1974".
"Malissa et al., "Superconducting Coplanar Waveguide Resonators for Low Temperature Pulsed Electron Spin Resonance Spectroscopy", Review of Scientific Instruments, vol. 84, No. 025116, Feb. 26, 2013, pp. 025116-1 to 0251116-5 doi: 10.1063/1.4792205".
"Narkowicz et al., "Planar microresonators for EPR experiments," Journal of Magnetic Resonance, vol. 175, No. 2, pp. 275-284, Aug. 2005".
"Sage et al., "Study of loss in superconducting coplanar waveguide resonators," Journal of Applied Physics, vol. 109, No. 6, p. 63915, Mar. 2011".
"Sienkiewicz et al., "Dielectric Resonator-Based Resonant Structure for Sensitive ESR Measurements at a High-Hydrostatic Pressures", Journal of Magnetic Resonance, vol. 177, 2005, pp. 278-290, doi: 10.1016/j.imr.2005.08.002".
"Torrezan et al., "Microstrip Resonators for Electron Paramagnetic Resonance Experiments", Review of Scientific Instruments, vol. 80, No. 075111, Jul. 31, 2009, pp. 075111-1 to 075111-6, doi: 101063/ 1.3186054".
"Tsutomu Nakada, et al., "31P NMR Spectroscopy of the Stomach by Zig-Zag Coil" Magnetic Resonance in Medicine 5, Apr. 28, 1987, pp. 449-455."
"Yong Pang, et al., "Resonant Mode Reduction in Radiofrequency Volume Coils for Ultrahigh Field Magnetic Resonance Imaging" National Institutes of Health Public Access Author Manuscript, Jul. 28, 2011, 13 pages".
Amsuss, R., et al., "Cavity QED with Magnetically Coupled Collective Spin States", Physical Review Letters 107, 060502, Aug. 3, 2011, 5 pages.
Ballester, Manuel, et al., "Inert Carbon Free Radicals. I. Perchlorodiphenylmethyl and Perchlorotriphenylmethyl Radical Series", Journal of the American Chemical Society 93:9, pp. 2215-2225, May 5, 1971, 11 pages.
Borneman, Troy W, et al., "Bandwith-Limited Control and Ringdown Suppression in High-Q Resonators", http://arXiv:1207.1139v2 [quant-ph], Jan. 21, 2013, 20 pages.
Borneman, T.W., et al., "Parallel Information Transfer in a Multinode Quantum Information Processor", Physical Review Letters 108, 140502, Apr. 2, 2012, 5 pages.
Bose, Sangita, et al., "Upper critical field in nanostructured Nb: Competing effects of the reduction in density of states and the mean free path", Physical Review B 74, 224502, Dec. 8, 2006, 5 pages.
Bushev, P., et al., "Ultralow-power spectroscopy of a rare-earth spin ensemble using a superconducting resonator", Physical Review B 84, 060501 (R), Aug. 5, 2011, 4 pages.
Dinardo, A. J., et al., "Superconducting Microstrip High-Q Microwave Resonators", Journal of Applied Physics 42, 1, pp. 186-189, Jan. 1971, 5 pages.
Duty, Tim, "Towards superconductor-spin ensemble hybrid quantum systems", Physics 3, 80, Sep. 27, 2010, 3 pages.
Feher, G., et al., "Electron Spin Resonance Experiments on Donors in Silicon. II. Electron Spin Relaxation Effects", Physical Review 114, 5, Jun. 1, 1959, 18 pages.
Feher, G., et al., "Polarization of Phosphorus Nuclei in Silicon", Physical Review Letters 103, pp. 501-503, 1956, 3 pages.
Fink, J. M., et al., "Dressed Collective Qubit States and the Tavis-Cummings Model in Circuit QED", Physical Review Letters 103, 083601, Aug. 17, 2009, 4 pages.

(56) References Cited

OTHER PUBLICATIONS

Hoult, D. I., et al., "The Quantum Origins of the Free Induction Decay Signal and Spin Noise", Journal of Magnetic Resonance 148, pp. 182-199, 2001, 18 pages.

Imamoglu, Atac, "Cavity QED Based on Collective Magnetic Dipole Coupling: Spin Ensembles as Hybrid Two-Level Systems", Physical Review Letters 102, 083602, Feb. 27, 2009, 4 pages.

Jiang, Liang, et al., "Distributed quantum computation based on small quantum registers", Physical Review A 76, 062323, Dec. 26, 2007, 22 pages.

Kubo, Y., et al., "Strong Coupling of a Spin Ensemble to a Superconducting Resonator", Physical Review Letters 105, 140502, Sep. 27, 2010, 4 pages.

Malissa, H., et al., "Superconducting coplanar waveguide resonators for low temperature pulsed electron spin resonance spectroscopy", http://arXiv:1202.6305v1 [cond-mat.mess-hall], Feb. 28, 2012, 4 pages.

Mehring, Michael, et al., "Spin-bus concept of spin quantum computing", Physical Review A 73, 052303, May 4, 2006, 12 pages.

Niarkowicz, R., et al., "Scaling of sensitivity and efficiency in planar microresonators for electron spin resonance", Review of Scientific Instruments 79, 084702, 2008, 9 pages.

NOA, USPTO Notice of Allowance in U.S. Appl. No. 13/931,382; dated Aug. 23, 2017.

Saito, K., "Critical Field Limitation of the Niobium Superconducting RF Cavity", The 10th Workshop on RF Superconductivity, Tsukuba, Japan, pp. 583-587, 2001, 5 pages.

Schuster, D. I., et al., "High-Cooperativity Coupling of Electron-Spin Ensembles to Superconducting Cavities", Physical Review Letters 105, 140501, Sep. 27, 2010, 4 pages.

Schweiger, Arthur, "Principles of Pulse Elctron Paramagnetic Resononace", Manipulation of electron and nuclear spins, pp. 138-139, Oxford University Press, 2001, 2 pages.

Skibbe, U., et al., "A 2D-NMR Method to Study Near-Surface Regions of Conductors", Colloids and Surfaces, 45, pp. 235-242, 1990, 8 pages.

Sodickson, Aaron, et al., "A generalized k-space formalism for treating the spatial aspects of a variety of NMR experiments", Progress in Nuclear Magnetic Resonance Spectroscopy 33, pp. 77-108, 1998, 32 pages.

Tinkham, Michael, "Introduction to Superconductivity", Second Edition, pp. 20-21, McGraw-Hill, Inc., 3 pages.

EPO, Extended European Search Report dated Jun. 17, 2019, in EP 16826951.2, 12 pgs.

CIPO, Office Action dated Mar. 19, 2019, in CA 2,897,536, 4 pgs.

EPO, Communication pursuant to Article 94(3) EPC dated May 4, 2020, in EP 14745648.7, 4 pgs.

USPTO, Non-final Office Action in U.S. Appl. No. 13/931,382 dated Nov. 21, 2016, 11 pages.

EPO, Communication pursuant to Article 94(3) dated Jun. 25, 2020, in EP 16826951.2, 4 pgs.

Chen, et al., "Microwave Electronics: Measurement and Materials Characterization", John Wiley & Sons, Technology & Engineering, Chapter 9, ISBN 0-470-84492-2, Nov. 19, 2004, 32 pgs.

Huang, et al., "Strip Line Power Splitter", University of Electronic Science and Technology Press, Microwave Transmission and its Circuits, 1st ed, pp. 264-65, Aug. 2010, cited by SIPO in the Notification of 1st Office Action in Chinese App. No. 201480007199.9 dated Jun. 13, 2017, 4 pgs.

Narkowicz, R., et al., "Planar microresonators for EPR experiments", Journal of Magnetic Resonance 175, pp. 275-284, 2005, 10 pages.

Petryakov, et al., "Segmented surface coil resonator for in vivo EPR applications at 1.1 GHz," Journal of Magnetic Resonance, vol. 198, pp. 8-14, May 2009, 7 pgs.

Rinard, George A, et al., "Relative Benefits of Overcoupled Resonators vs Inherently Low-Q Resonators for Pulsed Magnetic Resonance", Journal of Magnetic Resonance, Series A 108, pp. 71-81, 1994, 11 pages.

Xu, et al., "Transmission Line Resonator", Basics of the Microwave Technology, Science Press, 1st ed., pp. 164-167, Sep. 2009, cited by SIPO in the Notification of 1st Office Action in Chinese App. No. 201480007199.9 dated Jun. 13, 2017, 6 pgs.

EPO, Communication pursuant to Article 94(3) EPC dated Dec. 10, 2020, in EP 16826951.2, 5 pgs.

\* cited by examiner
† cited by third party

SHIFTING PHASE IN A RESONATOR DEVICE FOR MAGNETIC RESONANCE

CROSS-REFERENCE TO RELATED APPLICATIONS

This application claim priority to U.S. Provisional Application No. 62/196,166, filed on Jul. 23, 2015, which is hereby incorporated by reference.

BACKGROUND

The following description relates to a resonator device for magnetic resonance applications.

Magnetic resonance systems are used to study various types of samples and phenomena. In some magnetic resonance applications, the spins in a sample are polarized by a static, external magnetic field, and a resonator manipulates the spins by producing a magnetic field at a frequency near the spins' resonance frequencies. Resonators can be used, for example, in electron spin resonance (ESR), nuclear magnetic resonance (NMR), magnetic resonance imaging (MRI) and other applications.

DETAILED DESCRIPTION

In some aspects of what is described here, a resonator device includes a balun. The resonator device can be, for example, a resonator device for electron spin resonance (ESR) applications, nuclear magnetic resonance (NMR) applications, magnetic resonance imaging (MRI) applications or another application. In some examples, a resonator device includes two resonators that are parallel to each other and fed differentially by baluns configured to operate at the resonant frequency of the resonators. In the examples shown in FIGS. 1A, 1B, 2, 3, 4 and 5, the resonators are half-wavelength transmission line resonators that are identical in their design; and the baluns are narrowband baluns that each includes a microstrip line feed, two branches, a delay line in one of the branches and transmission lines at the ends of the branches. Additional or different resonators, baluns or other components may be included in some cases.

In some implementations, a resonator device having a high quality factor can produce a magnetic field that has a low mode volume. The resonator device can be used for magnetic applications to produce a microwave or radio frequency magnetic field that is substantially homogeneous across the sample in all three spatial dimensions. In some cases, the resonator device is less sensitive to DC (static) magnetic fields aligned along the direction of current flow in the conductors of the resonator device. For instance, the arrangement of conductors in the resonator device can reduce vortex losses.

Figure 1A:
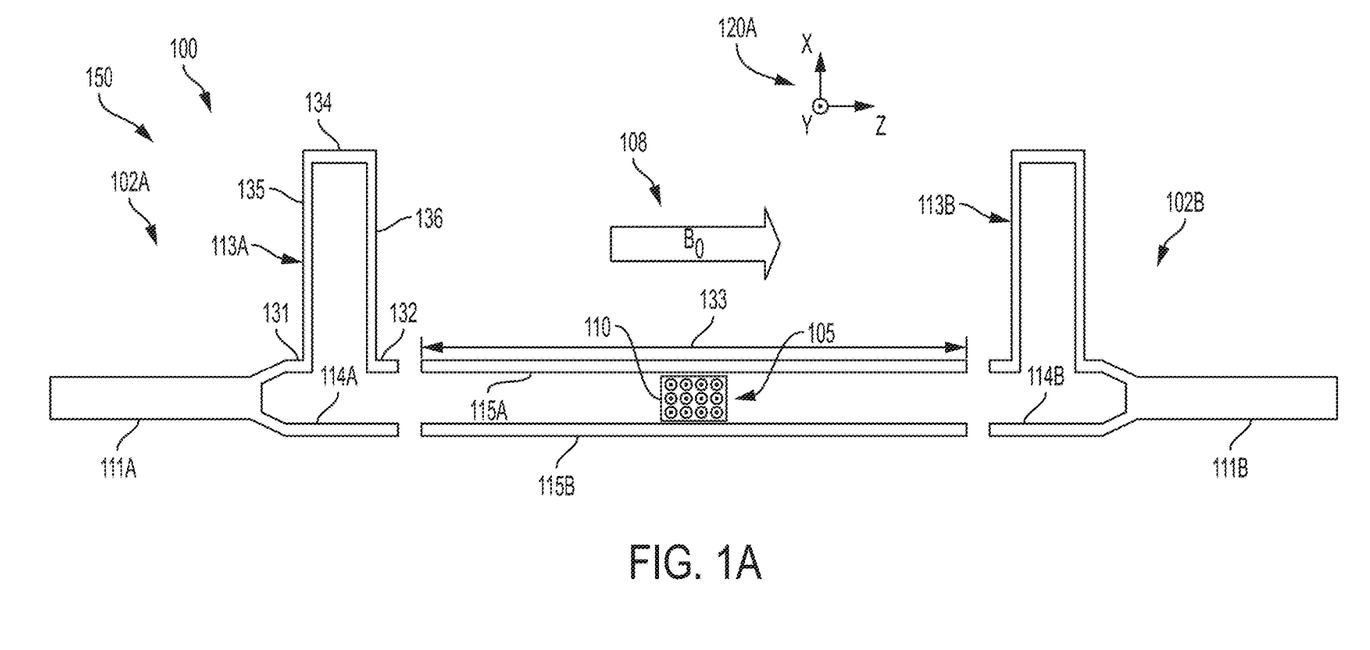
FIG. 1A is a schematic diagram showing aspects of an example resonator device.
Figure 1B:
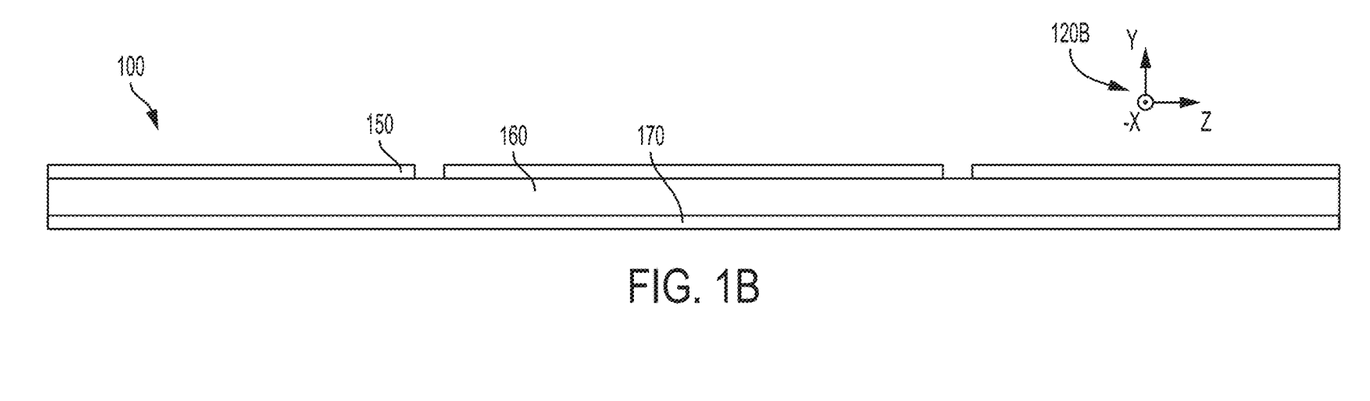
FIG. 1B is a schematic diagram showing additional aspects of the example resonator device 100 represented in FIG. 1A.

FIG. 1A is a schematic diagram showing aspects of an example resonator device 100. FIG. 1B is a schematic diagram showing additional aspects of the example resonator device 100 represented in FIG. 1A. The example resonator device 100 represented in FIGS. 1A and 1B includes a dielectric substrate 160, a ground plane 170 on a first side of the substrate, and conductors 150 on a second, opposite side of the substrate. The example resonator device 100 also includes a sample region 105 configured to support a magnetic resonance sample 110.

FIG. 1B provides a side view of the resonator device 100, showing the conductors 150, the dielectric substrate 160 and the ground plane 170. FIG. 1A provides a top view of the conductors 150. The coordinate axes 120A, 120B in the respective figures show the relative orientation of each view. A resonator device may include additional or different features, and the components of a resonator device may be arranged as shown or in another manner.

In some implementations, the dielectric substrate 160 includes a cavity or recess in the sample region 105, and the sample 110 can be positioned in the cavity or recess. The sample 110 can be, for example, a three dimensional sample containing a spin ensemble that is distributed over three spatial dimensions. In some examples, the sample 110 has a thickness (in the y-direction) of 100 micrometers (100 μm) and sits in a recess having a depth of 50 micrometer (50 μm) in the substrate 160. Another size sample may be used. The resonator device 100 may be configured to produce a substantially uniform microwave magnetic field over the full three-dimensional spatial extent of the sample 110. In some examples, the resonator device 100 produces a microwave magnetic field that is substantially uniform over a region that is 100 micrometers (100 μm) thick in the y-direction.

In some implementations, the dielectric substrate 160 is made of dielectric material such as, for example, sapphire, silicon, $MgO_2$, $LaAlO_3$, or another type of non-magnetic dielectric crystalline material. In some implementations, the conducting material on the dielectric substrate (e.g., the ground plane 170, the conductors 150, etc.) can be made of non-superconducting material (e.g., gold, copper, etc.), superconducting material (e.g., niobium, niobium titanium, niobium nitride, aluminum, yttrium barium copper oxide (aka, "YBCO"), magnesium diboride) or a combination of them. The conducting materials can be deposited on the substrate 160 by standard deposition processes. The substrate 160 can be etched or otherwise conditioned based on standard fabrication processes.

In some implementations, the ground plane 170 and the conductors 150 can be implemented as thin films on opposite sides of the dielectric substrate 160. In the example shown in FIG. 1B, the ground plane 170 and the conductors 150 define a microstrip transmission line structure. Generally, a microstrip transmission line structure can include any conducting material (non-superconducting material or superconducting material) on a first surface of a dielectric substrate separated from a ground plane on the opposite surface of the dielectric substrate. In some cases, the example resonator device 100 can be housed in a conductive enclosure (e.g., a copper box, or another type of conductive enclosure) of appropriate dimensions during operation.

Figure 3:
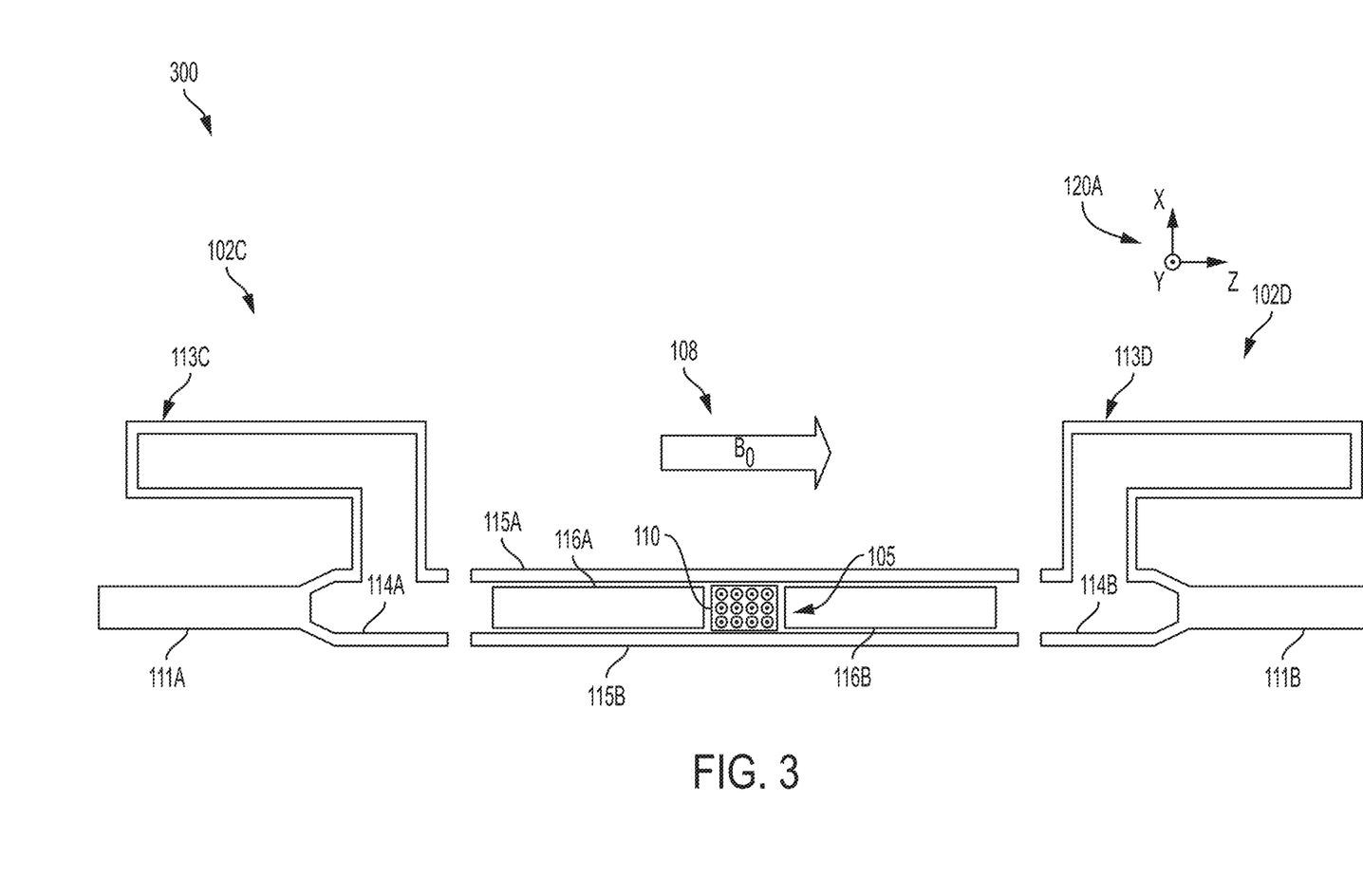
FIG. 3 is a schematic diagram showing aspects of another example resonator device.
Figure 4:
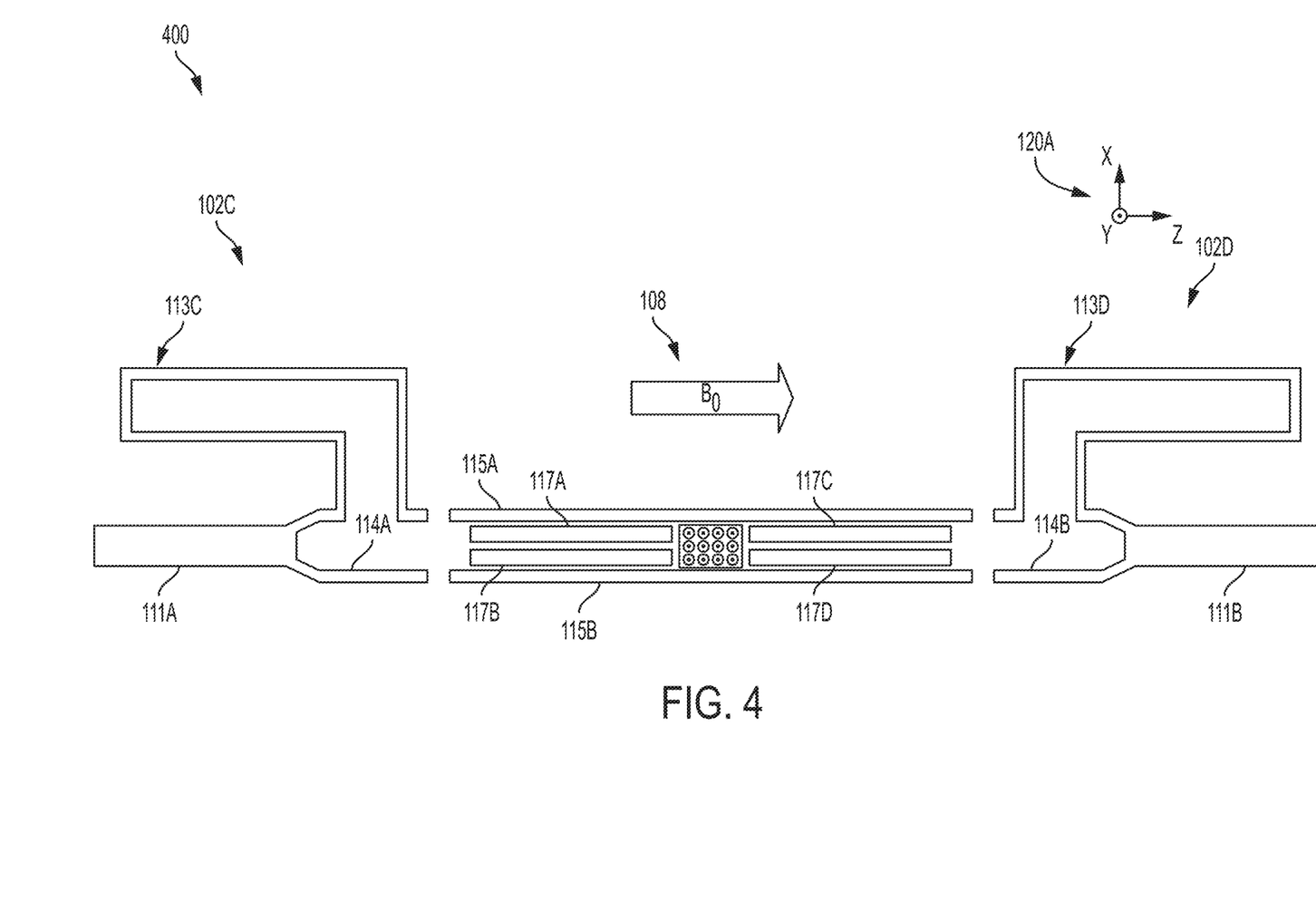
FIG. 4 is a schematic diagram showing aspects of another example resonator device.
Figure 5:
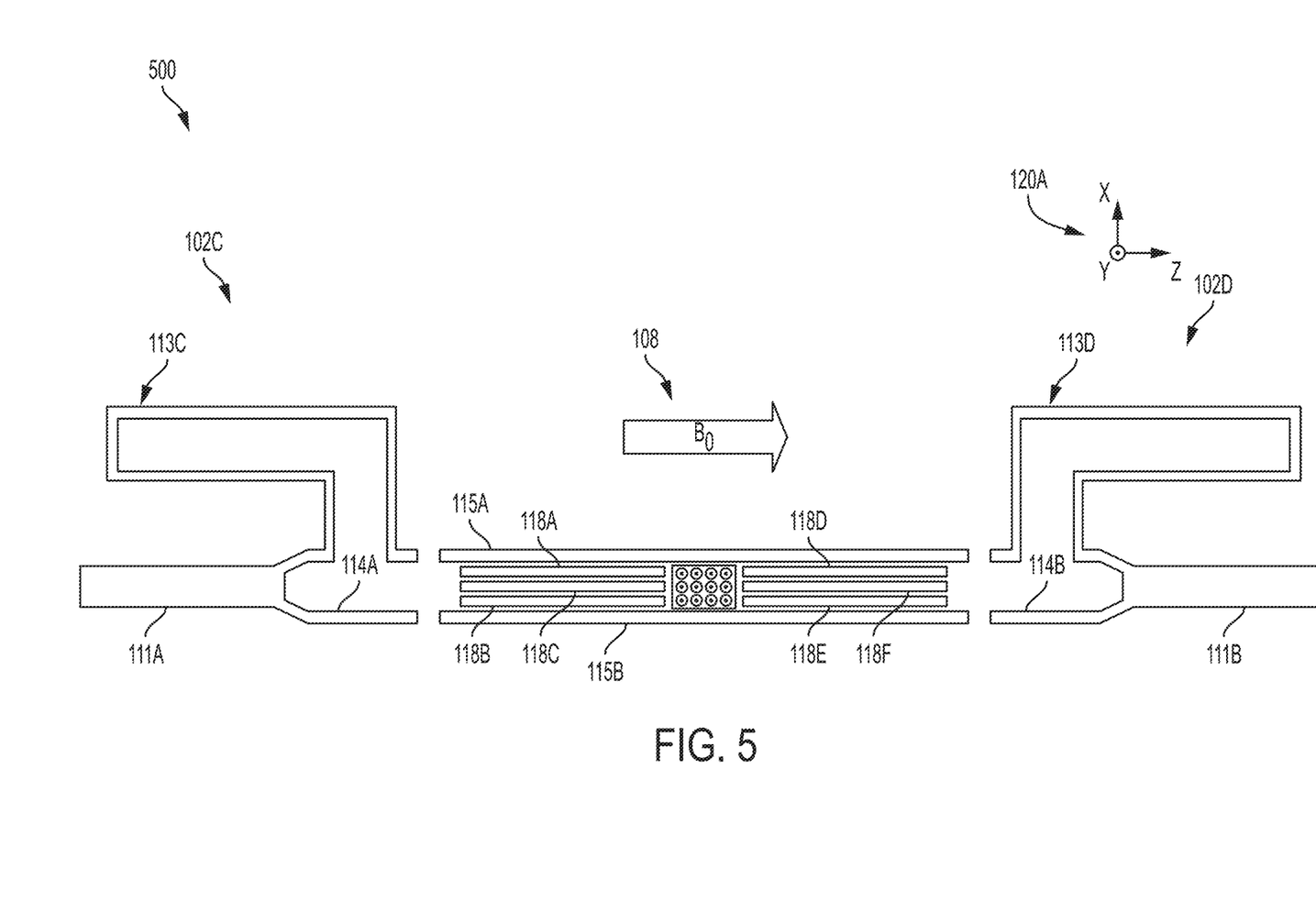
FIG. 5 is a schematic diagram showing aspects of another example resonator device.

As shown in FIG. 1A, the conductors 150 of the example resonator device 100 include a first resonator 115A, a second resonator 115B, a first balun 102A and a second balun 102B. The dielectric substrate 160 can support a magnetic resonance sample 110 in the sample region 105, between the first and second resonators 115A, 115B. In some implementations, the conductors 150 also include strips that reside between the first and second resonators about the sample region 105. For example, the strips can be implemented as elongate conductors that extend parallel to the resonators 115A, 115B on either side of the sample region 105. Examples are shown in FIGS. 3, 4 and 5.

In the example shown, the resonators 115A, 115B are implemented as conductor strips supported on the dielectric substrate 160. The example resonators 115A, 115B in FIG. 1A are parallel, elongate conductors that extend between the baluns 102A, 102B. The resonators 115A, 115B are configured to resonate at a resonance frequency; the resonance frequency of a resonator can be determined at least in part by its length. In the example shown in FIG. 1A, the resonators 115A, 115B are half-wavelength microstrip line resonators; and the length 133 of each resonator is $\lambda_0/2$, where $\lambda_0$ is the wavelength corresponding to the resonance frequency at which the resonators 115A, 115B operate.

In the example shown, the first and second baluns 102A, 102B are implemented as conductors having similar structures; the first and second baluns 102A, 102B have identical designs and opposite orientations on the dielectric substrate 160. The first and second baluns 102A, 102B reside at opposite ends of the elongate resonators 115A, 115B; the first balun 102A is coupled to the resonators 115A, 115B across the gaps at a first end of the resonators 115A, 115B, and the second balun 102B is coupled to the resonators 115A, 115B across the gaps at a second, opposite end of the resonators 115A, 115B.

The first balun 102A includes a feed 111A, two branches connected to the feed 111A, and a power splitter section between the feed 111A and the two branches. The branches of the first balun 102A are capacitively coupled to the respective first and second resonators 115A, 115B. A first branch extending from the feed 111A includes a first delay line 113A, and a second branch extending from the feed 111A includes a conducting strip 114A. The conducting strip 114A extends from the feed 111A to the gap between the branch and the second resonator 115B. The delay line 113A in the first branch is configured to produce a phase shift relative to the conducting strip 114A in the second branch.

Similar to the first balun 102A, the second balun 102B includes a feed 111B, two branches connected to the feed 111B, and a power splitter section between the feed 111B and the two branches. The branches of the second balun 102B are capacitively coupled to the respective first and second resonators 115A, 115B. A first branch extending from the feed 111B includes a second delay line 113B, and a second branch extending from the feed 111B includes a conducting strip 114B. The conducting strip 114B extends from the feed 111B to the gap between the branch and the second resonator 115B. The delay line 113B in the first branch is configured to produce a phase shift relative to the conducting strip 114B in the second branch.

As shown in FIG. 1A, the branches of the second balun 102B have the same structure and opposite orientation of the branches of the first balun 102A. In some examples, the feed of each balun has a first characteristic impedance, and the branches connected to the feed have respective characteristic impedances that are greater than the first characteristic impedance. For instance, the branches of the balun may have twice the characteristic impedance of the feed. In the example shown in FIG. 1A, the feeds 111A, 111B each have a characteristic impedance of fifty ohms (50Ω), and the branches extending from the feeds 111A, 111B each have a characteristic impedance of one hundred ohms (100Ω), which can maximize the power transferred to the resonators 115A, 115B. The feeds and branches may have other characteristic impedance values.

As shown in FIG. 1A, the first resonator 115A extends between the branch of the first balun 102A that includes the first delay line 113A and the branch of the second balun 102B that includes the second delay line 113B. The second resonator 115B extends between the other branches (the branches that do not include delay lines) of the first and second baluns 102A, 102B.

In the example shown in FIG. 1A, the delay lines 113A, 113B include conducting strips formed on the surface of the dielectric substrate 160. The first delay line 113A, for example, is a conducting strip that extends between first and second ends of the delay line 113A. The branch that includes the first delay line 113A has a first portion 131 connected between the feed 111A and the first end of the delay line 113A, and a second portion 132 connected to the second end of the delay line 113A. The second portion 132 of the branch extends from the second end of the delay line 113A to the gap between the branch and the first resonator 115A.

Figure 2:
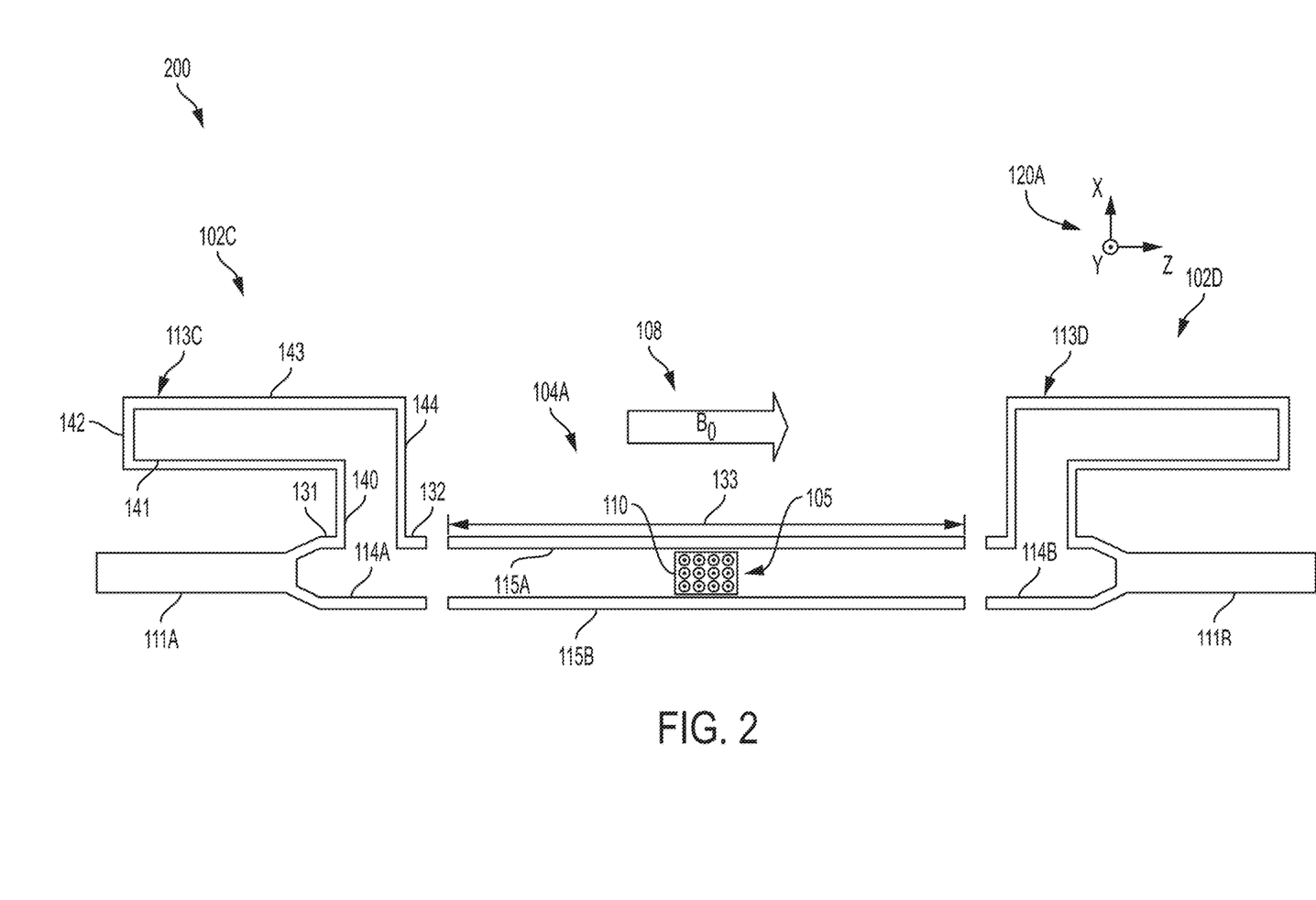
FIG. 2 is a schematic diagram showing aspects of another example resonator device.

In the example shown in FIG. 1A, the delay line 113A includes three delay line portions 134, 135, 136. The first delay line portion 135 extends (in the x-direction) from the first end of the delay line 113A, perpendicular to the first portion 131 of the first branch. The second delay line portion 136 extends (in the x-direction) from the second end of the delay line, perpendicular to the second portion 132 of the first branch. The third delay line portion 134 extends (in the z-direction) between the first and second delay line portions 135, 136. The delay line 113A includes two turns between the first and second delay line portions 135, 136. In particular, the delay line 113A includes a first turn where the first delay line portion 135 meets the third delay line portion 134, and a second turn where the second delay line portion 136 meets the third delay line portion 134. The delay line 113B in the second balun 102B has the same structure as the delay line 113A in the first balun 102A. The delay lines 113A, 113B can have another shape; an example is shown in FIG. 2. In some cases, the turns can be rounded turns (e.g., having a radius) or angled turns (e.g., at right angles, as shown), or the turns can have another shape.

In some implementations, a delay line in a branch of a balun can be configured to produce a 180-degree phase shift, relative to another branch in the balun. The example delay lines 113A, 113B shown in FIG. 1A are configured to produce a 180-degree phase shift in an electromagnetic signal at the resonance frequency of the first and second resonators 115A, 115B; the 180-degree phase shift produced by the delay lines 113A, 113B is relative to the phase of the same signal in the associated conducting strip 114A, 114B. For instance, the length of the first delay line 113A shown in FIG. 1A, which is the total combined length of the three delay portions 134, 135, 136, can be specified to produce the 180-degree phase shift. In the example shown in FIG. 1A, the delay lines 113A, 113B each have a total length of $\lambda_0/2$, where $\lambda_0$ is the wavelength corresponding to the resonance frequency at which the resonators 115A, 115B operate. In some cases, the phase shift produced by the baluns 102A, 102B increases the strength of the magnetic field produced in the sample region 105. For example, the microwave field strength can be several times stronger for the same current in some cases.

The example resonator device 100 shown in FIGS. 1A and 1B is configured for installation in a magnetic resonance system that generates a principal magnetic field $B_0$. The principal magnetic field $B_0$ can be a static magnetic field that polarizes a spin ensemble in the sample 110. The resonator device 100 can be oriented in the principal magnetic field $B_0$ as represented by the arrow 108 in FIG. 1A, such that the first and second resonators 115A, 115B extend parallel to the principal magnetic field $B_0$.

In some aspects of operation, the sample 110 is positioned on the substrate 160 in the sample region 105 between the resonators 115A, 115B. The sample 110 can be, for example, a magnetic resonance sample that includes an ensemble of electron spins or nuclear spins. The principal magnetic field $B_0$ can polarize the spins in the sample 110. The spins have a resonance frequency (or spin precession frequency) in the principal magnetic field $B_0$. The resonance frequency is typically in the MHz or GHz range (radio or microwave frequencies) in magnetic resonance applications. In operation, the resonators 115A, 115B are fed differentially by the baluns 102A, 102B and generate a microwave field at their resonance frequency. The time-varying field can be tuned to the resonance frequency of the spins in the sample 110, for instance, to manipulate the spins.

In some aspects of operation, the microwave signal is fed into the baluns 102A, 102B at their respective feeds 111A, 111B, and the microwave signal is divided equally into the two transmission lines formed by the branches in each of baluns 102A, 102B. The baluns 102A, 102B are each configured to convert the microwave signal to a pair of balanced microwave signals with 180 degrees phase difference at the ends of the transmission lines. One of the transmission lines in each of the baluns 102A, 102B includes the delay line, and the microwave signal through the delay line traverses a longer electrical path than the microwave signal through the other transmission line (i.e., the transmission line without the delay line). Relative to the transmission line without the delay line, the transmission line with the delay line provides 180 degrees more electrical length for signals at the resonance frequency of the resonators 115A, 115B. The relative difference in electrical length produces a relative phase shift in the signals at the output of the baluns 102A, 102B. The relative phase shift produces the pair of balanced signals that are communicated from the baluns 102A, 102B to the resonators 115A, 115B.

In some aspects of operation, the baluns 102A, 102B drive the two resonators 115A, 115B through the capacitive gap at the ends of the resonators 115A, 115B. The baluns 102A, 102B are symmetrically arranged on opposite sides of the resonators 115A, 115B. In the example shown, the symmetric two-port arrangement satisfies the impedance matching condition over a large range of the gap size which is used for quality factor adjustment. Each of the delay lines 113A, 113B can apply a 180-degree phase shift to the microwave signal that is fed into the first resonator 115A, relative to the phase of the microwave signal that is fed into the second resonator 115B. As such, the phase shift produced by the delay line 113A compensates for the phase shift produced by the other delay line 113B.

In some aspects of operation, the resonators 115A, 115B are simultaneously excited at a single resonance frequency corresponding to the odd mode. The resonators can be excited differentially and carry the same current distributions in opposite directions. In such instances, the magnetic fields generated by the two resonators 115A, 115B constructively add in the sample region 105. When operated as half-wavelength resonators, the current over the length 133 of the resonators 115A, 115B has a cosine distribution. In such instances, the magnetic field generated by the resonators 115A, 115B is at a maximum in the sample region 105 where the sample 110 resides. In the example shown, the direction of the magnetic field generated by the resonators 115A, 115B is oriented in the y-direction (perpendicular to the xz-plane). Thus, the spin ensemble in the sample 110 experiences microwave-frequency magnetic field that is primarily oriented in the y-direction, which is perpendicular to the principal magnetic field $B_0$ (oriented in the z-direction).

In some instances, the example resonator device 100 can be operated to produce a time-varying magnetic field in the sample region 105. For example, the resonator device 100 may produce a microwave frequency field configured to manipulate spins in the sample 110. In some instances, the example resonator device 100 can be operated to produce a detection signal. The detection signal can be produced by a voltage induced across the resonators 115A, 115B by precession of spins in the sample 110. For example, the spins can inductively couple to the resonators 115A, 115B as the spins precess in the principal magnetic field $B_0$. The resonators 115A, 115B can transfer the detection signal to the feeds 111A, 111B. The feeds 111A, 111B can transfer the detection signal to an external system, where it can be detected, recorded, and further processed.

FIG. 2 is a schematic diagram showing aspects of another example resonator device 200. The example resonator device 200 includes baluns having another configuration. FIG. 2 provides a top view of the conductors on one side of a dielectric substrate. The conductors shown in FIG. 2 can be implemented as an alternative to the example conductors 150 shown in FIGS. 1A and 1B. For example, the example resonator device 200 can includes a dielectric substrate, a ground plane on a first side of the substrate, and the conductors shown in FIG. 2 on a second, opposite side of the substrate.

In the example shown in FIG. 2, the design of the conductors is identical to the design of the conductors 150 shown in FIG. 1A, except that the delay lines 113C, 113D in FIG. 2 have a different structure than the delay lines 113A, 113B shown in FIG. 1A. As shown in FIG. 2, the conductors of the example resonator device 200 include the first resonator 115A, the second resonator 115B, a first balun 102C and a second balun 102D. The first balun 102C in FIG. 2 includes the delay line 113C but otherwise is the same as the first balun 102A in FIG. 1A; similarly, the second balun 102D in FIG. 2 includes the delay line 113D but otherwise is the same as the second balun 102B in FIG. 1A.

In the example shown in FIG. 2, the delay lines 113C, 113D include conducting strips formed on the surface of a substrate. The first delay line 113C extends between first and second ends of the delay line 113C, and the first and second ends of the delay line 113C are connected to the respective first and second portions 131, 132 of the first branch extending from the feed 111A.

The example delay line 113C shown in FIG. 2 includes five delay line portions 140, 141, 142, 143, 144. The first delay line portion 140 extends (in the x-direction) from the first end of the delay line 113C, perpendicular to the first portion 131 of the first branch. The second delay line portion 144 extends (in the x-direction) from the second end of the delay line, perpendicular to the second portion 132 of the first branch. The third delay line portion 141 extends (in the z-direction) from the first delay line portion 140, perpendicular to the first delay line portion 140. The fourth delay line portion 143 extends (in the z-direction) from the second delay line portion 144, perpendicular to the second delay line portion 144. The delay line 113C includes four turns between the first and second delay line portions 140, 144. In particular, the delay line 113C includes a first turn where the first delay line portion 140 meets the third delay line portion 141, a second turn where the second delay line portion 144 meets the fourth delay line portion 143, a third turn where the third delay line portion 141 meets the fifth delay line portion 142, and a fourth turn where the fourth delay line portion 143 meets the fifth delay line portion 142. The delay line 113D in the second balun 102D has the same structure (and opposite orientation) as the delay line 113C in the first balun 102C. The delay lines 113C, 113D can have another shape. In some cases, the turns can be rounded turns (e.g., having a radius) or angled turns (e.g., at right angles, as shown), or the turns can have another shape.

In the example resonator device 200 shown in FIG. 2, the third and fourth delay line portions 141, 143 extend in the z-direction, parallel to the first and second resonators 115A, 115B. In this example, the resonators 115A, 115B and the third and fourth delay line portions 141, 143 are aligned with the principal magnetic field $B_0$, which is oriented in the z-direction as shown in FIG. 2. In some instances, the principal magnetic field $B_0$ can produce vortex motion loss in the conductors that are oriented to conduct current perpendicular to the principal magnetic field $B_0$. Therefore, by orienting the resonators 115A, 115B and portions of the delay lines in a direction that is parallel to the principal magnetic field $B_0$, vortex motion loss may be reduced or suppressed in some cases. Losses may be reduced by other configurations that reduce the length of conductors that conduct current perpendicular to the principal magnetic field $B_0$.

The example delay lines 113C, 113D shown in FIG. 2 are configured to produce a 180-degree phase shift in an electromagnetic signal at the resonance frequency of the first and second resonators 115A, 115B. For instance, the length of the delay line 113C, which is the total combined length of the five delay line portions 140, 141, 142, 143, 144, can be specified to produce the 180-degree phase shift; the 180-degree phase shift produced by the delay lines 113C, 113D is relative to the phase of the same signal in the associated conducting strip 114A, 114B. In some instances, the example resonator device 200 shown in FIG. 2 may operate as described with respect to the example resonator device 100 shown in FIGS. 1A and 1B.

FIG. 3 is a schematic diagram showing aspects of another example resonator device 300. The example resonator device 300 includes conductor strips 116A, 116B about the sample region 105 between the resonators 115A, 115B. The conductor strips 116A, 116B are elongate conductors that extend in a direction (the z-direction, in the example shown) that is parallel to the resonators 115A, 115B and parallel to the principal magnetic field $B_0$. Each of the conductor strips 116A, 116B has a first end near the sample region 105 and a second end near one of the respective gaps between the resonators 115A, 115B and the baluns 102A, 102B.

FIG. 3 provides a top view of the conductors on one side of a dielectric substrate. The conductors shown in FIG. 3 can be implemented as an alternative to the example conductors 150 shown in FIGS. 1A and 1B. For example, the example resonator device 300 can includes a dielectric substrate, a ground plane on a first side of the substrate, and the conductors shown in FIG. 3 on a second, opposite side of the substrate. The conductor strips 116A, 116B can increase concentration of the microwave magnetic field in the sample region 105, and thereby improve operation of the resonator device in some instances.

In some systems, the perpendicular component of an RF or microwave magnetic field impinging a perfect conductor is zero. To reduce the mode volume of the resonators 115A, 115B, two conductor strips 116A, 116B may be positioned on the sides of the sample 110. In the example shown in FIG. 3, there are conductors on all sides of the sample 110. The tangential component of the magnetic field can generate surface currents on the conductor strips 116A, 116B, for example, along the edges of the conductor strips 116A, 116B. When the conductor strips 116A, 116B are made of superconducting material, the edges of the conductor strips 116A, 116B that are perpendicular to the principal magnetic field $B_0$ (e.g., the edges at the ends, which are oriented in the x-direction) can give rise to the vortex motion loss which can reduce the quality factor of the resonator device. In the example shown in FIG. 3, vortex motion loss can be proportional to the magnitude and length of the x-component of the current in the conductor strips 116A, 116B. To reduce such vortex motion loss, the conductor strips 116A, 116B can be divided into smaller sections; examples are shown in FIGS. 4 and 5.

FIG. 4 is a schematic diagram showing aspects of another example resonator device 400. The example resonator device 400 shown in FIG. 4 includes four conductor strips 117A, 117B, 117C, 117D about the sample region 105 between the resonators 115A, 115B. The four conductor strips 117A, 117B, 117C, 117D shown in FIG. 4 are narrower than the two conductor strips 116A, 116B shown in FIG. 3. The narrower width of the conductor strips 117A, 117B, 117C, 117D may reduce vortex motion loss in some cases.

FIG. 5 is a schematic diagram showing aspects of another example resonator device 500. The example resonator device 500 shown in FIG. 5 includes six conductor strips 118A, 118B, 118C, 118D, 118E, 118F about the sample region 105 between the resonators 115A, 115B. The six conductor strips 118A, 118B, 118C, 118D, 118E, 118F shown in FIG. 5 are narrower than the four conductor strips 117A, 117B, 117C, 117D shown in FIG. 4. The narrower width of the conductor strips 118A, 118B, 118C, 118D, 118E, 118F may reduce vortex motion loss in some cases.

Figure 6:
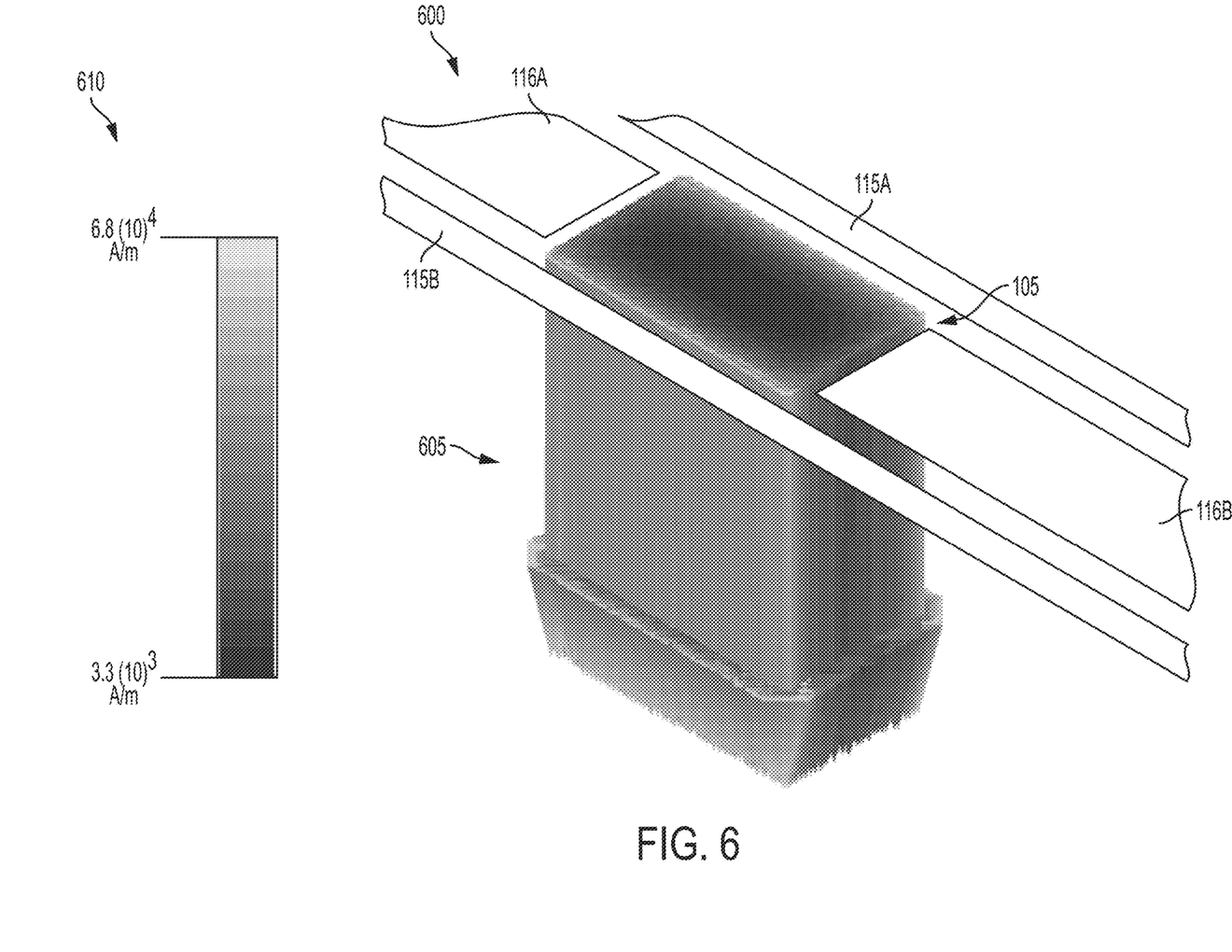
FIGS. 6 and 7 are schematic diagrams showing simulated magnetic fields produced in a sample region by the example resonator device 300 shown in FIG. 3.
Figure 7:
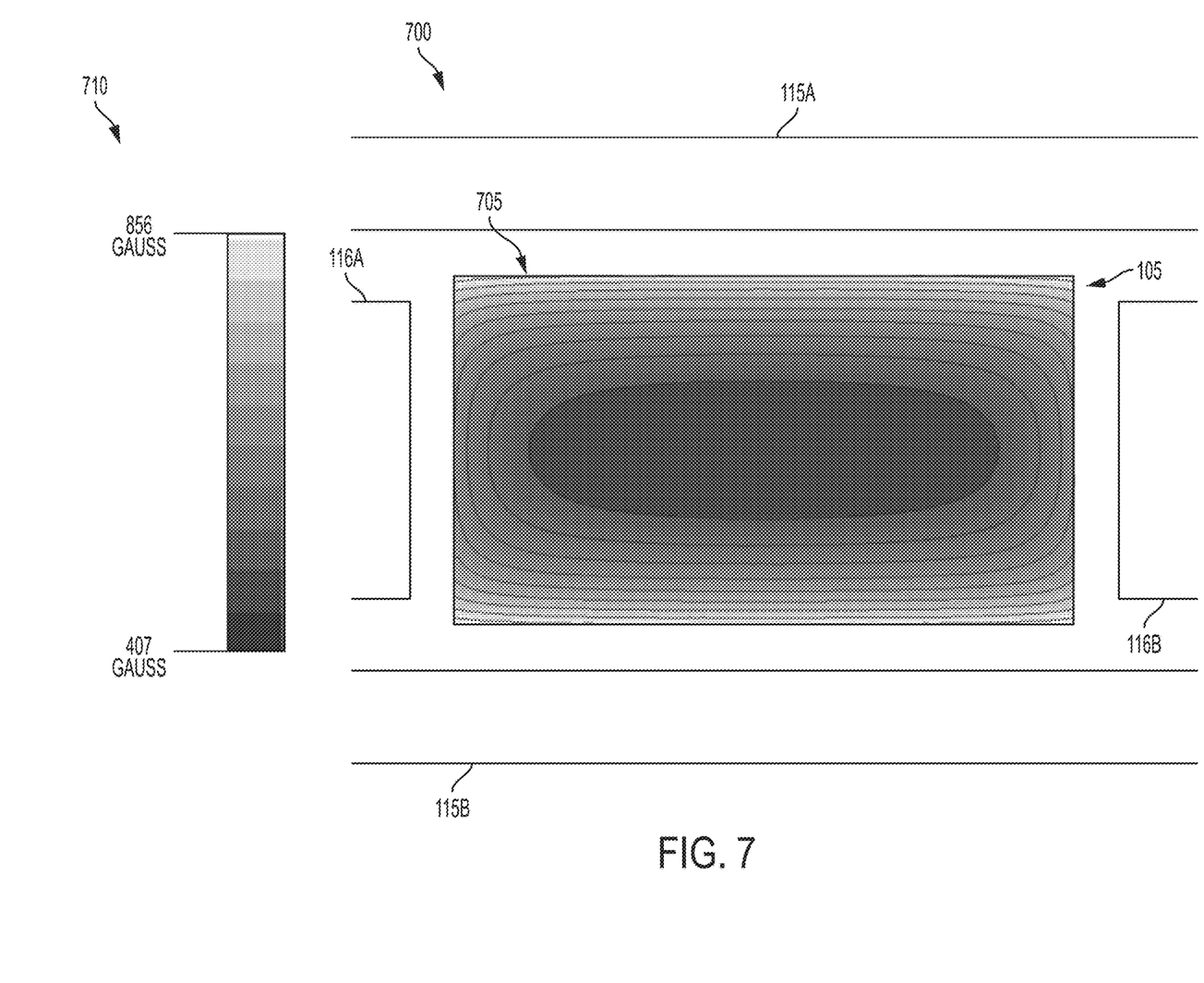
Figure 8:
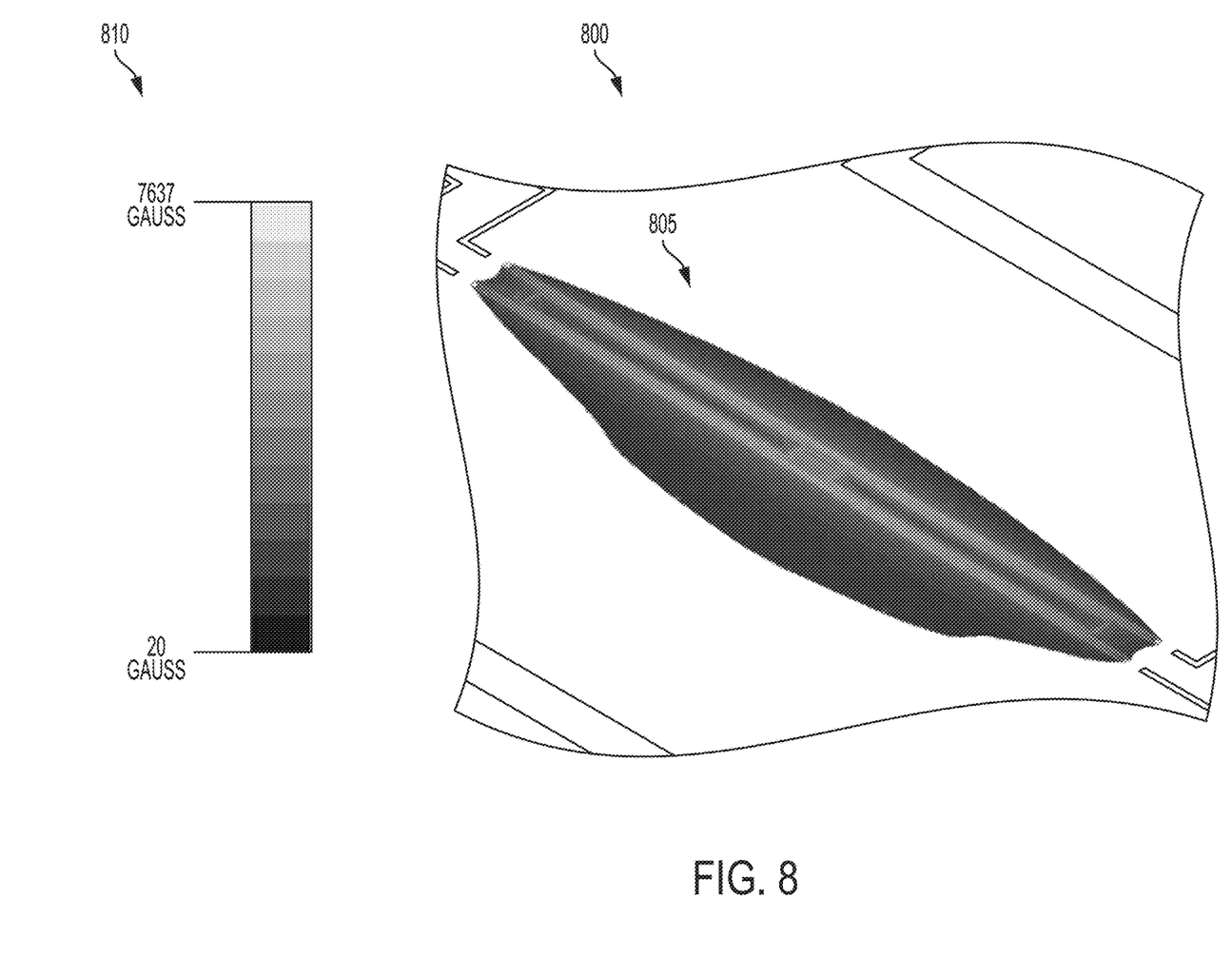
FIG. 8 is a schematic diagram showing simulated magnetic fields produced in a substrate by the example resonator device 300 shown in FIG. 3.

FIGS. 6-8 are schematic diagrams showing aspects of magnetic fields that may be generated by operation of the example resonator device 300 shown in FIG. 3. The diagrams shown in FIGS. 6-8 are generated by computer simulations, using ANSYS® HFSS software (available from ANSYS, Inc. of Canonsburg, Pa.). In the simulations, the resonators 115A, 115B are driven by a 1 Watt microwave source at a frequency of approximately 10 GigaHertz (GHz). The example resonator device 300 may operate at another frequency. In the simulations, the feed has a width of 358 micrometers (µm), the branches each have a width of 524 µm, the gap between the branches and the resonators is 150 µm, the resonators each have a width of 521 µm and a length of 6195 µm, the resonance frequency of the resonators is 10 GHz, the spacing between the two resonators is 300 µm, and the width of the conductor strips between the resonators is 168 µm.

FIGS. 6 and 7 are schematic diagrams showing simulated magnetic fields produced in the sample region 105 when a 1 Watt microwave voltage source is applied to the resonator device. FIG. 6 provides a perspective view of the vector magnetic field in the plane of the conductors. In FIG. 6, a diagram 600 shows the location and spatial direction of the simulated magnetic field 605, and a legend 610 shows the field strengths represented in the diagram 600. FIG. 7 provides a top view of the magnetic field in the plane of the conductors. In FIG. 7, a diagram 700 shows the location and spatial distribution of the simulated magnetic field 705, and a legend 710 shows the field strengths represented in the diagram 700.

FIG. 8 is a schematic diagram showing simulated magnetic fields produced over the dielectric substrate. FIG. 8 provides a perspective view of the magnetic field in and below the plane of the conductors. In FIG. 8, a diagram 800 shows the location and spatial distribution of the simulated magnetic field 805, and a legend 810 shows the field strengths represented in the diagram 800.

Figure 9:
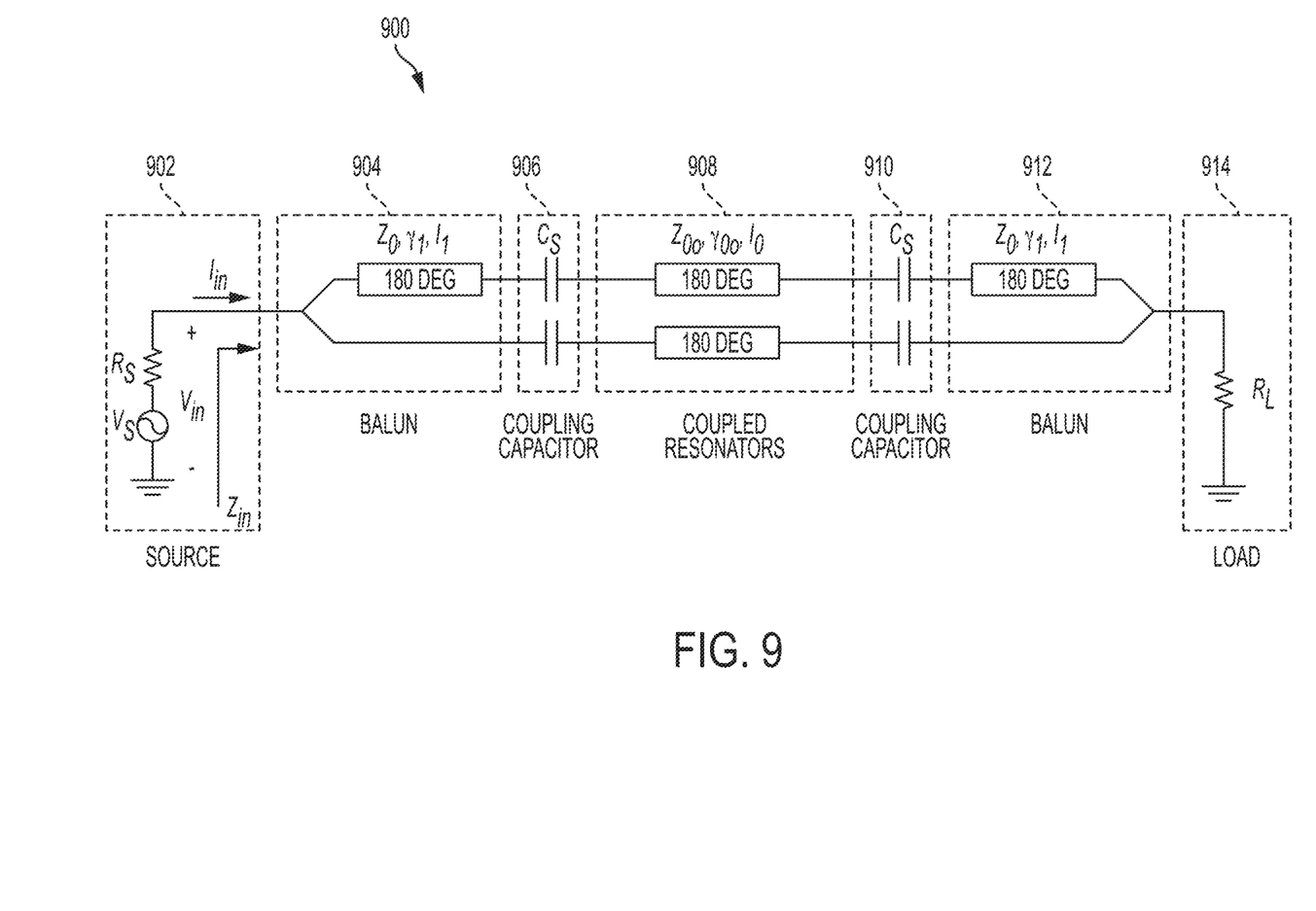
FIG. 9 is a schematic diagram showing an example circuit model for analyzing a resonator device.

FIG. 9 is a schematic diagram showing an example transmission line model 900 for analyzing a resonator device. In some cases, the circuit model 900 may be used to analyze the example resonator devices shown in FIGS. 1A, 1B, 2, 3, 4, 5 or another resonator device. The example circuit model 900 includes a source 902, two baluns 904 and 912, two coupling capacitors 906 and 910, coupled resonators 908 and a load 914. The baluns 904, 912 in FIG. 9 represent a model for the two baluns of the resonator device; the coupled resonators 908 in FIG. 9 represent a model for the two resonators of the resonator device; and the coupling capacitors 906, 910 represent the capacitive coupling between the resonators and the branches of the respective baluns. The balun 904 is modeled between the source 902 and the coupling capacitor 906; the coupling capacitor 906 is modeled between the balun 904 and the coupled resonators 908; the coupled resonators 908 are modeled between the coupling capacitor 906 and the coupling capacitor 910; the coupling capacitor 910 is modeled between the coupled resonators 908 and the balun 912; and the balun 912 is modeled between the coupling capacitor 906 and the load 914.

The source 902 includes a microwave voltage source $V_s$ coupled between ground and a source resistance $R_s$. The source 902 is shown with a current $I_{in}$ and impedance $Z_{in}$. The baluns 904, 910 each include a 180 degree phase shift in one of the lines. Each of the baluns 904, 910 is shown with an impedance $Z_0$, a current $I_1$, and a coupling coefficient $\gamma_0$. The coupled resonators 908 each include 180 degree phase shift in both of the lines. Each of the coupled resonators 908 is shown with an impedance $Z_{0o}$, a current $I_0$, and a coupling coefficient $\gamma_{0o}$. The coupling capacitors 906, 910 each include capacitances $C_s$. The load 914 includes a load resistance $R_L$ connected to ground.

In a general aspect of what is described, a resonator device includes a delay line.

In a first example, a resonator device includes a dielectric substrate; a ground plane on a first side of the substrate; conductors on a second, opposite side of the substrate; and a sample region configured to support a magnetic resonance sample between the first and second resonators. The conductors include first and second resonators and two baluns. The baluns each include a respective feed, a first branch and a second branch. The feed of each balun is connected to the first and second branches of the balun; and the first and second branches of each balun are capacitively coupled to the respective first and second resonators. The first branch of each balun includes a delay line configured to produce a phase shift relative to the second branch of the balun.

Implementations of the first example may include one or more of the following features. The delay line can extend between first and second ends of the delay line. The first branch can include a first portion connected between the feed and the first end of the delay line, and a second portion connected to the second end of the delay line, extending to a gap between the first branch and the first resonator. The second branch can extend from the feed to a gap between the second branch and the second resonator. The delay line can include a first delay line portion that extends from the first end of the delay line, perpendicular to the first portion of the first branch; a second delay line portion that extends from the second end of the delay line, perpendicular to the second portion of the first branch; and one or more turns between the first and second delay line portions. The delay line can include a third delay line portion that extends from the first delay line portion, perpendicular to the first delay line portion; a fourth delay line portion that extends from the second delay line portion, perpendicular to the second delay line portion; and one or more turns between the third and fourth delay line portions. The first and second resonators can include first and second elongate resonator strips, and the third and fourth delay line portions can extend in a direction parallel to the first and second resonators.

Implementations of the first example may include one or more of the following features. The delay line can be configured to produce a 180-degree phase shift, relative to the third branch, in an electromagnetic signal at a resonance frequency of the first and second resonators. The feed can have a first characteristic impedance, and the first and second branches can have respective characteristic impedances greater than the first characteristic impedance. The first and second branches can have twice the characteristic impedance of the feed. The conductors can be made of superconducting material. The first and second resonators can be half-wavelength resonators. The conductors on the second side of the substrate can include strips about the sample region, between the first and second resonators.

Implementations of the first example may include one or more of the following features. The resonator device can be configured for installation in a magnetic resonance system that generates a principal magnetic field. The first and second resonators can include first and second elongate resonator strips that extend parallel to the principal magnetic field.

In a second example, a resonator device includes a first resonator, a second resonator, a sample region configured to support a magnetic resonance sample between the first and second resonators, and means for delivering microwave signals to the first and second resonators. The microwave signals delivered to the first resonator have a phase that is shifted, relative to the microwave signals delivered to the second resonator, by the means for delivering microwave signals.

Implementations of the second example may include one or more of the following features. The means for delivering microwave signals can include a balun. The balun can include a feed, a first branch and a second branch. The feed can be connected to the first and second branches. The first and second branches can be capacitively coupled to the respective first and second resonators. The first branch can include a delay line configured to produce the phase shift. The means for delivering microwave signals can include a first balun comprising a first pair of branches capacitively coupled to the respective first and second resonators; and a second balun comprising a second pair of branches capacitively coupled to the respective first and second resonators.

The first and second resonators and the first and second baluns can include superconducting material on a dielectric substrate. The resonator device can include the dielectric substrate and a ground plane. The dielectric substrate can support the first and second resonators and the means for delivering microwave signals.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A resonator device comprising:
   a dielectric substrate;
   a ground plane on a first side of the substrate;
   conductors on a second, opposite side of the substrate, the conductors comprising:
     first and second resonators; and
     two baluns, each respective balun comprising a feed, a first branch and a second branch, the feed of each balun connected to the first and second branches of the balun, the first and second branches of each balun capacitively coupled to the respective first and second resonators, the first branch of each balun comprising a delay line configured to produce a phase shift relative to the second branch of the balun; and
   a sample region configured to support a magnetic resonance sample between the first and second resonators.

2. The resonator device of claim 1, wherein:
   the delay line of each balun extends between first and second ends of the delay line;
   the first branch of each respective balun comprises:
     a first portion connected between the feed of the balun and the first end of the delay line of the balun;
     a second portion connected to the second end of the delay line of the balun, extending to a gap between the first branch of the balun and the first resonator; and
   the second branch of each balun extends from the feed of the balun to a gap between the second branch of the balun and the second resonator.

3. The resonator device of claim 2, wherein the delay line of each respective balun comprises:
   a first delay line portion that extends from the first end of the delay line of the balun, perpendicular to the first portion of the first branch of the balun;
   a second delay line portion that extends from the second end of the delay line of the balun, perpendicular to the second portion of the first branch of the balun; and
   one or more turns between the first and second delay line portions of the balun.

4. The resonator device of claim 3, wherein the delay line of each respective balun comprises:
   a third delay line portion that extends from the first delay line portion of the balun, perpendicular to the first delay line portion of the balun;
   a fourth delay line portion that extends from the second delay line portion of the balun, perpendicular to the second delay line portion of the balun; and
   one or more turns between the third and fourth delay line portions of the balun.

5. The resonator device of claim 4, wherein first and second resonators comprise first and second elongate resonator strips, and the third and fourth delay line portions of each balun extend in a direction parallel to the first and second resonators.

6. The resonator device of claim 1, wherein the delay line of each balun is configured to produce a 180-degree phase shift, relative to the second branch of the balun, in an electromagnetic signal at a resonance frequency of the first and second resonators.

7. The resonator device of claim 1, wherein the resonator device is configured for installation in a magnetic resonance system that generates a principal magnetic field, and the first and second resonators comprise first and second elongate resonator strips that extend parallel to the principal magnetic field.

8. The resonator device of claim 1, wherein the feed of each balun has a first characteristic impedance, and the first and second branches of each balun have respective characteristic impedances greater than the first impedance.

9. The resonator device of claim 8, wherein the first and second branches of each balun have twice the characteristic impedance of the feed of the balun.

10. The resonator device of claim 1, wherein the conductors comprise superconducting material.

11. The resonator device of claim 1, wherein the first and second resonators are half-wavelength resonators.

12. The resonator device of claim 1, wherein the conductors on the second side of the substrate further comprise a plurality of strips about the sample region, between the first and second resonators.

13. A resonator device comprising:
    a first resonator;
    a second resonator;
    a sample region configured to support a magnetic resonance sample between the first and second resonators; and
    means for delivering microwave signals to the first and second resonators, wherein the microwave signals delivered to the first resonator comprise a phase shift relative to the microwave signals delivered to the second resonator,
    wherein the means for delivering microwave signals comprises:
      a first balun comprising a first pair of branches capacitively coupled to the respective first and second resonators; and a second balun comprising a second pair of branches capacitively coupled to the respective first and second resonators, wherein the first and second resonators and the first and second baluns comprise superconducting material on a dielectric substrate.

14. The resonator device of claim 13, wherein the first and second baluns comprise respective feeds connected to the first and second pairs of branches, and each of the first and second pairs of branches comprises a delay line configured to produce the phase shift.

15. The resonator device of claim 13, comprising a ground plane on the dielectric substrate.

* * * * *